(12) United States Patent
Jung

(10) Patent No.: US 7,648,878 B2
(45) Date of Patent: Jan. 19, 2010

(54) METHOD FOR FABRICATING SEMICONDUCTOR DEVICE WITH RECESS GATE

(75) Inventor: Tae-Woo Jung, Kyoungki-do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 110 days.

(21) Appl. No.: 11/314,544

(22) Filed: Dec. 20, 2005

(65) Prior Publication Data

US 2007/0004128 A1  Jan. 4, 2007

(30) Foreign Application Priority Data

Jun. 30, 2005  (KR) .................. 10-2005-0058148

(51) Int. Cl.
 *H01L 21/336* (2006.01)
(52) U.S. Cl. .............. 438/270; 438/431; 438/439; 438/443; 438/424; 438/440; 438/448; 438/404; 438/405; 438/271; 438/272; 438/273; 438/274; 438/707; 438/710; 438/713; 438/706; 438/689; 257/306; 257/307; 257/308; 257/396; 257/329; 257/331; 257/E27.084; 257/E21.218; 257/241; 257/330; 257/242
(58) Field of Classification Search .............. 438/270
See application file for complete search history.

(56) References Cited

U.S. PATENT DOCUMENTS

| 4,630,356 | A | * | 12/1986 | Christie et al. | ........... 438/444 |
|---|---|---|---|---|---|
| 5,362,665 | A | * | 11/1994 | Lu | ........... 438/253 |
| 5,753,554 | A | * | 5/1998 | Park | ........... 438/296 |
| 5,801,082 | A | * | 9/1998 | Tseng | ........... 438/424 |
| 6,222,225 | B1 | * | 4/2001 | Nakamura et al. | ........... 257/315 |
| 6,239,001 | B1 | * | 5/2001 | Takaishi | ........... 438/431 |
| 6,417,047 | B1 | * | 7/2002 | Isobe | ........... 438/258 |
| 6,465,831 | B1 | * | 10/2002 | Park et al. | ........... 257/306 |
| 6,476,444 | B1 | * | 11/2002 | Min | ........... 257/330 |
| 6,541,810 | B2 | * | 4/2003 | Divakaruni et al. | ........... 257/302 |
| 6,620,681 | B1 | * | 9/2003 | Kim et al. | ........... 438/257 |
| 6,734,056 | B2 | * | 5/2004 | Mandelman et al. | ........... 438/212 |
| 6,740,954 | B2 | * | 5/2004 | Lee | ........... 257/499 |
| 6,743,675 | B2 | * | 6/2004 | Ding | ........... 438/257 |
| 6,808,981 | B2 | * | 10/2004 | Mandelman et al. | ........... 438/243 |

(Continued)

FOREIGN PATENT DOCUMENTS

JP  2000-208613  7/2000

(Continued)

*Primary Examiner*—Fernando L Toledo
*Assistant Examiner*—Ankush k Singal
(74) *Attorney, Agent, or Firm*—Blakely, Sokoloff, Taylor & Zafman LLP

(57) ABSTRACT

A pad oxide layer is formed on a substrate. A pad nitride layer is formed on the pad oxide layer. The pad nitride layer and the pad oxide layer are patterned. Predetermined portions of the substrate are etched using the pad nitride layer as an etch barrier to thereby form trenches used as device isolation regions. The trenches are filled with an insulation layer to thereby form device isolation regions. The pad nitride layer is removed. Recesses are formed by etching predetermined portions of the pad oxide layer and the substrate. The pad oxide layer is removed. A gate oxide layer is formed on the recesses and on the substrate. Gate structures of which bottom portions are buried in the recesses on the gate oxide layer are formed.

19 Claims, 6 Drawing Sheets

U.S. PATENT DOCUMENTS

| | | | |
|---|---|---|---|
| 6,818,937 B2 * | 11/2004 | Noble et al. | 257/302 |
| 6,855,601 B2 * | 2/2005 | Gajda | 438/259 |
| 6,858,893 B2 * | 2/2005 | Ishibashi | 257/302 |
| 6,939,765 B2 * | 9/2005 | Kim et al. | 438/259 |
| 6,964,897 B2 * | 11/2005 | Bard et al. | 438/243 |
| 7,015,099 B2 * | 3/2006 | Kim et al. | 438/257 |
| 7,064,377 B2 * | 6/2006 | Hagemeyer et al. | 257/315 |
| 7,132,331 B2 * | 11/2006 | Jang et al. | 438/259 |
| 7,163,865 B2 * | 1/2007 | Kim | 438/270 |
| 7,355,242 B2 * | 4/2008 | Sumino et al. | 257/315 |
| 2002/0019113 A1 * | 2/2002 | Chung | 438/424 |
| 2002/0094619 A1 * | 7/2002 | Mandelman et al. | 438/192 |
| 2002/0100952 A1 * | 8/2002 | Hong | 257/510 |
| 2002/0153572 A1 * | 10/2002 | Kusunoki | 257/368 |
| 2002/0160578 A1 * | 10/2002 | Choi | 438/424 |
| 2003/0001200 A1 * | 1/2003 | Divakaruni et al. | 257/330 |
| 2003/0034520 A1 * | 2/2003 | Kusunoki | 257/344 |
| 2003/0119260 A1 * | 6/2003 | Kim et al. | 438/257 |
| 2004/0009435 A1 * | 1/2004 | Chung | 430/312 |
| 2004/0009674 A1 * | 1/2004 | Lee et al. | 438/694 |
| 2004/0178450 A1 * | 9/2004 | Lee et al. | 257/347 |
| 2004/0248363 A1 * | 12/2004 | Bard et al. | 438/243 |
| 2004/0266118 A1 * | 12/2004 | Han et al. | 438/294 |
| 2005/0014338 A1 * | 1/2005 | Kim et al. | 438/275 |
| 2005/0042833 A1 * | 2/2005 | Park et al. | 438/282 |
| 2005/0118800 A1 * | 6/2005 | Brakensiek et al. | 438/633 |
| 2005/0136616 A1 * | 6/2005 | Cho et al. | 438/425 |
| 2005/0173744 A1 * | 8/2005 | Kim et al. | 257/296 |
| 2005/0173759 A1 * | 8/2005 | Kim et al. | 257/331 |
| 2005/0272233 A1 * | 12/2005 | Lee et al. | 438/585 |
| 2005/0275014 A1 * | 12/2005 | Kim et al. | 257/330 |
| 2005/0275069 A1 * | 12/2005 | Haddad et al. | 257/629 |
| 2006/0019498 A1 * | 1/2006 | Ali | 438/706 |
| 2006/0038220 A1 * | 2/2006 | Kusters et al. | 257/315 |
| 2006/0205150 A1 * | 9/2006 | Dong | 438/257 |
| 2006/0270150 A1 * | 11/2006 | Lee | 438/243 |
| 2006/0270151 A1 * | 11/2006 | Lee | 438/243 |
| 2007/0048938 A1 * | 3/2007 | Yun et al. | 438/257 |

FOREIGN PATENT DOCUMENTS

| | | |
|---|---|---|
| JP | 2004-111662 | 4/2004 |
| KR | 10-0498590 | 6/2005 |
| KR | 10-0539265 | 12/2005 |

\* cited by examiner

METHOD FOR FABRICATING SEMICONDUCTOR DEVICE WITH RECESS GATE

FIELD OF THE INVENTION

An embodiment of the present invention relates to a method for fabricating a semiconductor device; and, more particularly, to a method for fabricating a semiconductor device with recess gates.

DESCRIPTION OF RELATED ARTS

Recently, a refresh characteristic has been deteriorated due to short channels formed during a sub-100 nm level dynamic random access memory (DRAM) fabrication. To overcome this limitation, a recess gate (R-gate) technology has been introduced. The R-gate technology refers to recessing an active region in a thickness of several tens of nanometers and burying a portion of a gate in the recessed region.

If a semiconductor device with the aforementioned recess gate is fabricated, shortened channels due to the large-scale of integration can be formed longer in length, and thus, the refresh characteristic may be improved.

FIG. 1 is a cross-sectional view illustrating a conventional semiconductor device with recess gates.

As shown in FIG. 1, trenches 12 are formed in predetermined portions of a substrate 11. Insulation layers functioning as device isolation regions 13 are buried in the trenches 12, and recess patterns 14 are formed with a certain depth in an active region of the substrate 11.

Subsequently, a gate oxide layer 15 is formed over the recess patterns 14 and the substrate 11, and recess gate structures are formed on the gate oxide layer 15. Each of the recess gate structures includes a polysilicon layer 16, a tungsten silicide layer 17, and a gate hard mask layer 18 formed in sequential order.

As described above, bottom portions of the conventional recess gate structures are buried in the recess patterns 14, thereby increasing the channel lengths (CH) of channel regions defined by the recess gate structures.

However, an etch loss 'D' greatly increases at corners of the device isolation regions 13 adjacent to the active region, i.e., by approximately 200 Å or more, while several etching processes are performed before the recess gate structures are formed employing the conventional technology. Due to the etch loss of the device isolation regions 13, electric fields increase at the device isolation regions 13, and may result in a deteriorated refresh characteristic.

If a line/space type mask is used in the recess gate formation process, it may be inevitable for the device isolation regions 13 to be exposed to follow-up etching processes, and thus, such etch loss of the device isolation regions should be reduced to the minimum.

SUMMARY OF THE INVENTION

An embodiment of the invention is a method for fabricating a semiconductor device that is capable of improving a refresh characteristic, by reducing etch loss at corners of device isolation regions adjacent to an active region during a recess gate formation process.

In accordance with an aspect of the present invention, there is provided a method for fabricating a semiconductor device, including: forming a pad oxide layer on a substrate; forming a pad nitride layer on the pad oxide layer; patterning the pad nitride layer and the pad oxide layer; etching predetermined portions of the substrate using the pad nitride layer as an etch barrier to thereby form trenches used as device isolation regions; filling an insulation layer into the trenches to thereby form device isolation regions; removing the pad nitride layer; forming recesses by etching predetermined portions of the pad oxide layer and the substrate; removing the pad oxide layer; forming a gate oxide layer on the recesses and on the substrate; and forming gate structures of which bottom portions are buried in the recesses on the gate oxide layer.

BRIEF DESCRIPTION OF THE DRAWINGS

The above and other features of embodiments of the present invention will become better understood with respect to the following description of the specific embodiments given in conjunction with the accompanying drawings, in which.

DETAILED DESCRIPTION OF THE INVENTION

A method for fabricating a semiconductor device with recess gates in accordance with specific embodiments of the present invention will be described in detail with reference to the accompanying drawings.

FIGS. 2A to 2J are cross-sectional views illustrating a method for fabricating a semiconductor device in accordance with a specific embodiment of the present invention.

Figure 1:
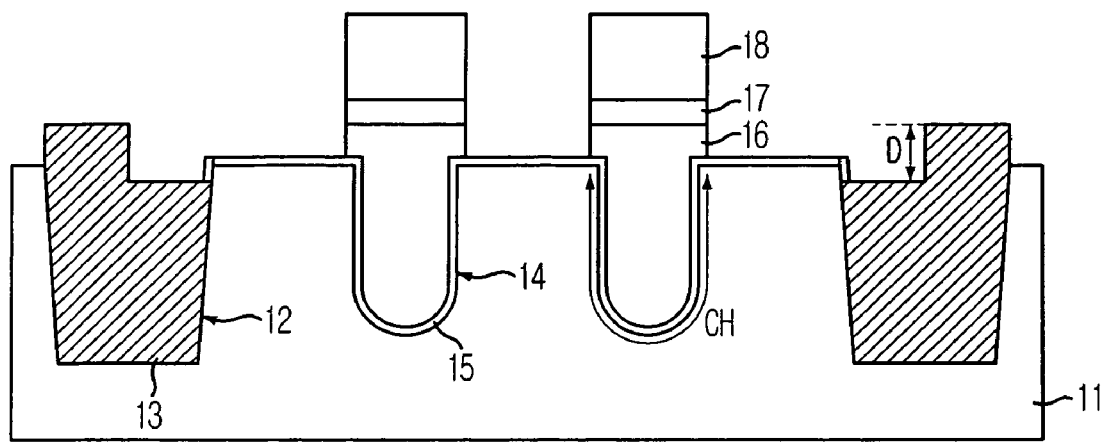
FIG. 1 is a cross-sectional view illustrating a conventional semiconductor device with recess gate structures.
Figure 2A:
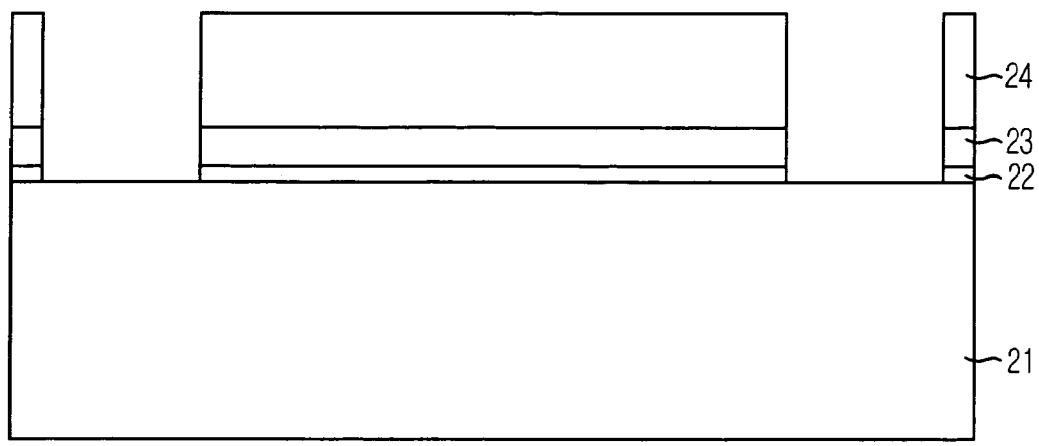
FIGS. 2A to 2J are cross-sectional views illustrating a method for fabricating a semiconductor device in accordance with a specific embodiment of the present invention.

As shown in FIG. 2A, a pad oxide layer 22 is formed on a substrate 21. Herein, the pad oxide layer 22 is formed in a thickness ranging from approximately 100 Å to approximately 300 Å at a temperature ranging from approximately 750° C. to approximately 850° C. using a chemical vapor deposition (CVD) method. If the pad oxide layer 22 is formed by the CVD method using hydrogen fluoride (HF), an etch rate of the pad oxide layer 22 is approximately 2.5 times faster than an oxide layer formed by a thermal oxidation process, i.e., a thermal oxide layer, and a high density plasma oxide layer. That is, an etch selectivity of the pad oxide layer 22 to subsequent device isolation regions during a follow-up wet etching process is controlled to be at approximately 2:1 or higher by forming the pad oxide layer 22 using the CVD method.

Subsequently, a pad nitride layer 23 is formed on the pad oxide layer 22. Herein, the pad nitride layer 23 is formed in a thickness ranging from approximately 500 Å to approximately 1,000 Å using a low pressure CVD (LPCVD) method. The pad nitride layer 23 is also referred to as the low pressure (LP) nitride layer because the pad nitride layer 23 is formed by employing the LPCVD method.

Furthermore, a photoresist layer (not shown) is formed on the pad nitride layer 23, and the photoresist layer is patterned by an exposure and developing process to form masks 24 used for the isolation purpose (hereinafter referred to as "ISO masks").

Moreover, the pad nitride layer 23 and the pad oxide layer 22 are etched using the ISO masks 24 as an etch barrier.

Figure 2B:
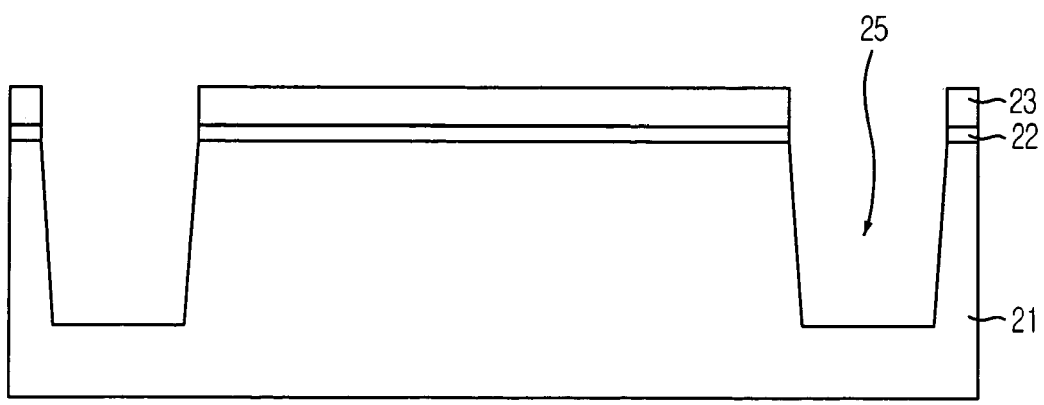

As shown in FIG. 2B, the ISO masks 24 are stripped. Next, exposed portions of the substrate 21 designated for device isolation regions are etched using the pad nitride layer 23 as an etch barrier to thereby form trenches 25.

Figure 2C:
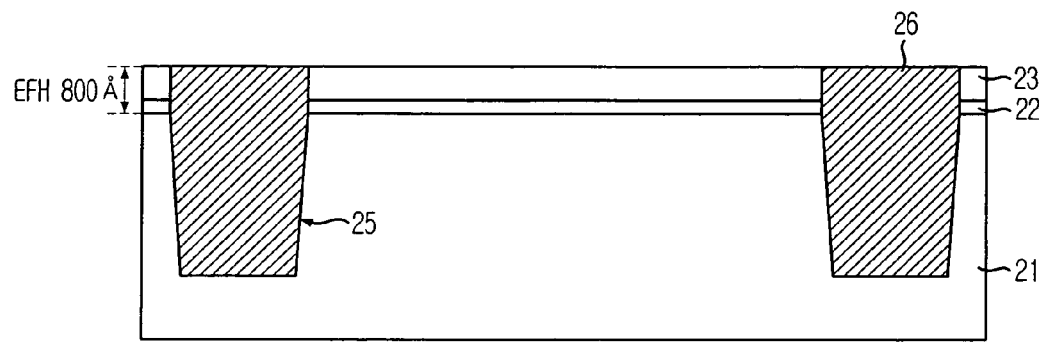

As shown in FIG. 2C, an insulation layer 26 fills the trenches 25. Herein, the insulation layer can include high density plasma oxide.

In more detail, the filling of the trenches 25 involves forming the insulation layer 26 over the entire surface of the resulting structure shown in FIG. 2B. A chemical mechanical polishing (CMP) process is performed on the insulation layer 26 until the pad nitride layer 23 is exposed, and as a result, device isolation regions 26 are formed as seen in FIG. 2C.

If the thickness of the pad oxide layer 22 and the pad nitride layer 23 are approximately 200 Å and approximately 600 Å, respectively, an effective field oxide height (EFH) becomes approximately 800 Å after the above CMP process is performed.

Figure 2D:
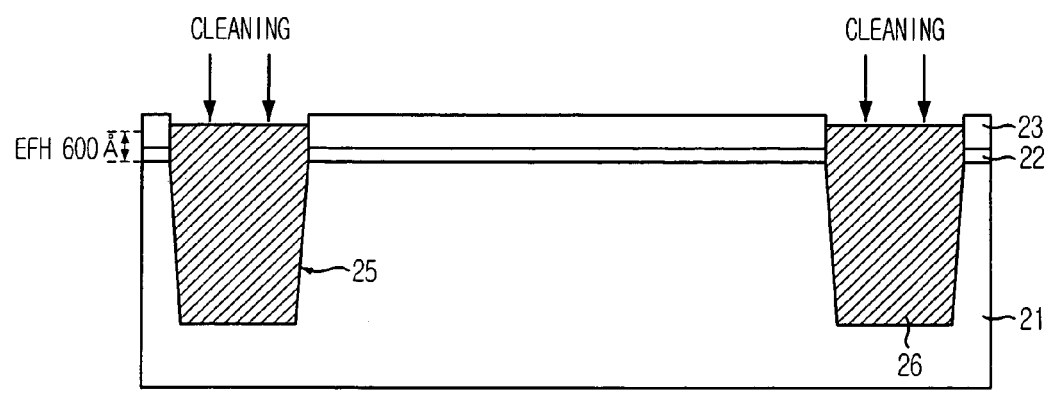

As shown in FIG. 2D, a cleaning process is performed after the CMP process to maintain the EFH at approximately 600 Å. Herein, the cleaning process is performed on the device isolation regions 26, which include high density plasma oxide. A buffered oxide etchant (BOE) or hydrogen fluoride (HF) is used in the cleaning process, and the pad nitride layer 23 functions as a barrier. Thus, the pad nitride layer 23 is not removed, and the device isolation regions 26 are selectively etched, resulting in the lowered EFH of approximately 600 Å. That is, approximately 200 Å of top portions of the device isolation regions 26 are removed by the cleaning process.

Figure 2E:
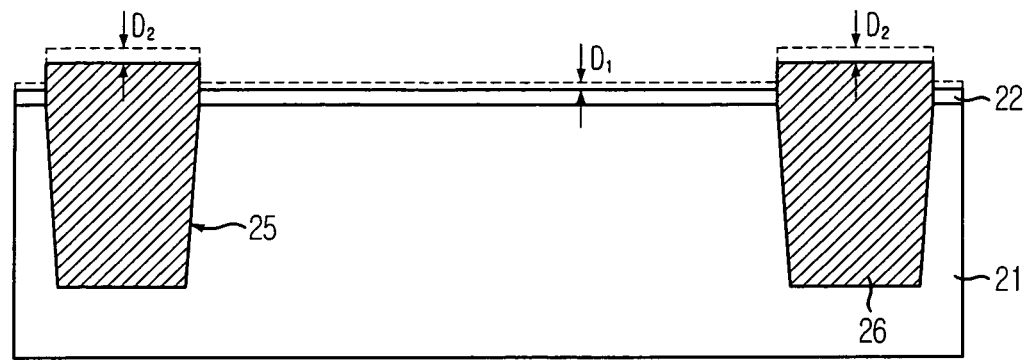

As shown in FIG. 2E, the pad nitride layer 23 is stripped. Herein, the stripping of the pad nitride layer 23 utilizes a phosphoric acid solution ($H_3PO_4$).

During the stripping of the pad nitride layer 23, the pad oxide layer 22 and the device isolation regions 26 are also etched. For example, the pad oxide layer 22 loses a thickness of approximately 50 Å ($D_1$) and remains with a thickness of approximately 150 Å, and the device isolation regions 26 lose a thickness of approximately 20 Å ($D_2$) and remain with a thickness of approximately 380 Å from the top surface of the substrate 21.

Herein, the pad oxide layer 22 and the device isolation regions 26 are etched to different thicknesses during the stripping of the pad nitride layer 23 although both layers are made of an identical oxide material. The reason is because the pad oxide layer 22 is an oxide layer formed by employing a CVD method, and the device isolation regions 26 are oxide layers formed with high density plasma oxide. The pad oxide layer 22 formed by the CVD method has an etch rate approximately 2.5 times faster than a thermal oxide layer or a high density plasma oxide layer.

Preferably, during the stripping of the pad nitride layer 23, a height difference between the surface of the substrate 21 and the device isolation regions 26 is controlled to be within a range of approximately 400 Å and approximately 700 Å.

Figure 2F:
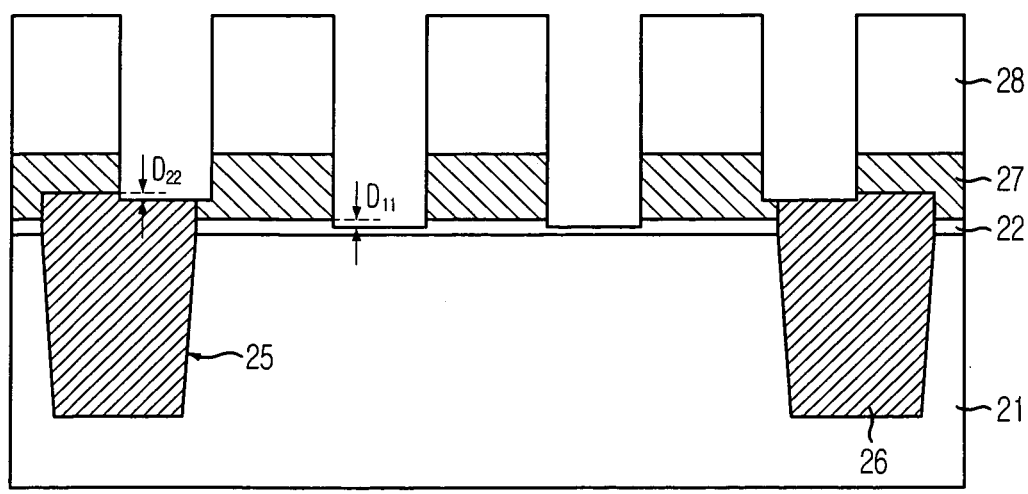

As shown in FIG. 2F, a hard mask layer 27 is formed over the pad oxide layer 22. Herein, the hard mask layer 27 includes polysilicon and is formed in a thickness ranging from approximately 800 Å to approximately 1,000 Å by employing an LPCVD method. Herein, the thickness of the hard mask layer 27 is less than an etched depth of subsequent recess patterns.

Alternatively, a silicon oxynitride (SiON) layer or a plasma enhanced nitride layer can be employed as a hard mask layer 27 instead of polysilicon.

Subsequently, recess masks 28 are formed on portions of the hard mask layer 27 using a photolithography process.

Furthermore, the hard mask layer 27 is etched using the recess masks 28 as an etch barrier.

Portions of the pad oxide layer 22 and the device isolation regions 26 are also etched during the etching of the hard mask layer 27. The portions of the pad oxide layer 22 lose a thickness of approximately 20 Å ($D_{11}$), and remain with a thickness of approximately 130 Å. The portions of the device isolation regions 26 lose a thickness of approximately 20 Å ($D_{22}$), and remain with a thickness of approximately 360 Å from the surface of the pad oxide layer 22. Herein, the etched thicknesses of the pad oxide layer 22 and the device isolation regions 26 during the etching of the hard mask layer 27 are identical because the etching of the hard mask layer 27 is performed by employing a dry etching process.

The pad oxide layer 22 can remain in a thickness ranging from approximately 100 Å to approximately 250 Å from the surface of the substrate 21 during the etching of the hard mask layer 27.

Figure 2G:
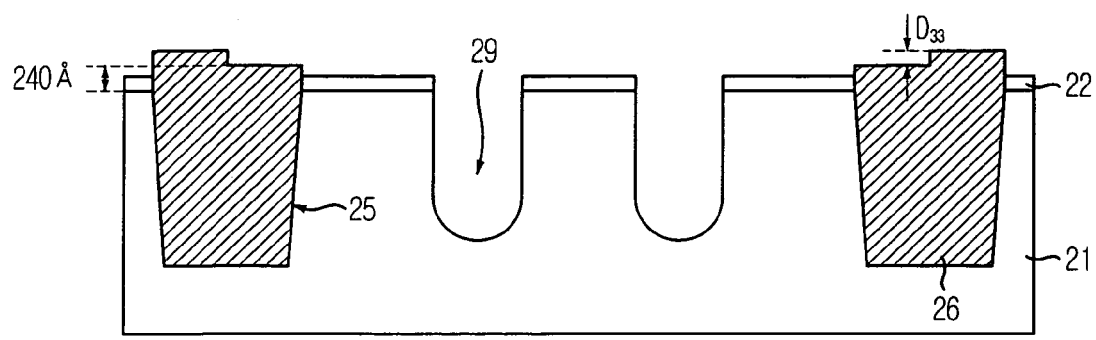

As shown in FIG. 2G, the recess masks 28 are stripped, and predetermined portions of the pad oxide layer 22 are etched using the hard mask layer 27 as an etch barrier. After the predetermined portions of the pad oxide layer 22 are etched, exposed portions of the substrate 21 are continuously etched to form recesses 29. Herein, a depth of the individual recess 29 is controlled to be within a range of approximately 1,100 Å and approximately 1,800 Å. Also, the hard mask layer 27 is completely etched during the etching process for forming the recesses 29, and thus, does not remain.

The etching process for forming the recesses 29 utilizes a mixed gas including hydrogen bromide (HBr), chlorine ($Cl_2$), oxygen ($O_2$), nitrogen ($N_2$), sulfur hexafluoride ($SF_6$), and nitrogen trifluoride ($NF_3$) as an etching gas. Hereinafter, the etching process using the above mixed gas as an etching gas is referred to as the 'recess etching process.'

During such recess etching process, portions of the device isolation regions 26 are etched. For example, the portions of the device isolation regions 26 lose a thickness of approximately 250 Å ($D_{33}$), and thus, the device isolation regions have a step structure at one corner.

Consequently, the device isolation regions 26 remain with a thickness of approximately 240 Å from the surface of the substrate 21.

On the other hand, after the recess etching process, a post-etching treatment process can be performed to improve an overall profile.

Figure 2H:
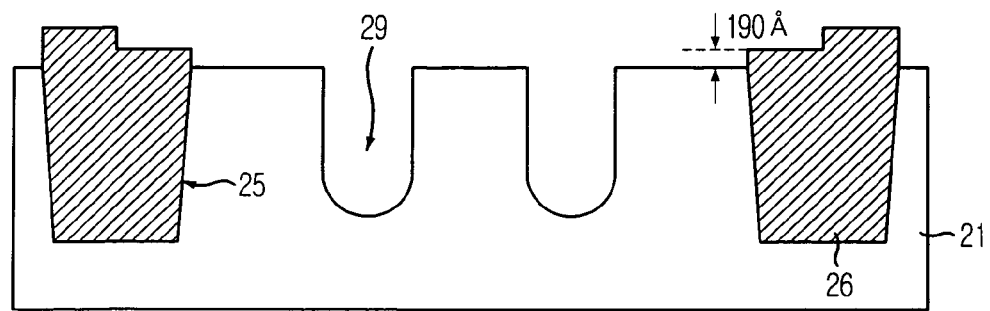

As shown in FIG. 2H, the pad oxide layer 22 is stripped. Herein, the stripping of the pad oxide layer 22 uses HF, and portions of the device isolation regions 26 lose approximately 50 Å in thickness while the pad oxide layer 22 is stripped with a thickness of approximately 130 Å. As it is shown, the pad oxide layer 22 formed by employing the CVD method has a much faster etch rate than the device isolation regions 26 formed by employing high density plasma oxide. Thus, the device isolation regions 26 remain in a thickness of approximately 190 Å from the surface of the substrate 21.

After the stripping of the pad oxide layer 22, a threshold (Vt)-pre-cleaning process is performed. Preferably, after the Vt-pre-cleaning process is performed, a height difference between the substrate 21 and the device isolation regions 26 is controlled to be within a range of approximately 150 Å and 200 Å.

Figure 2I:
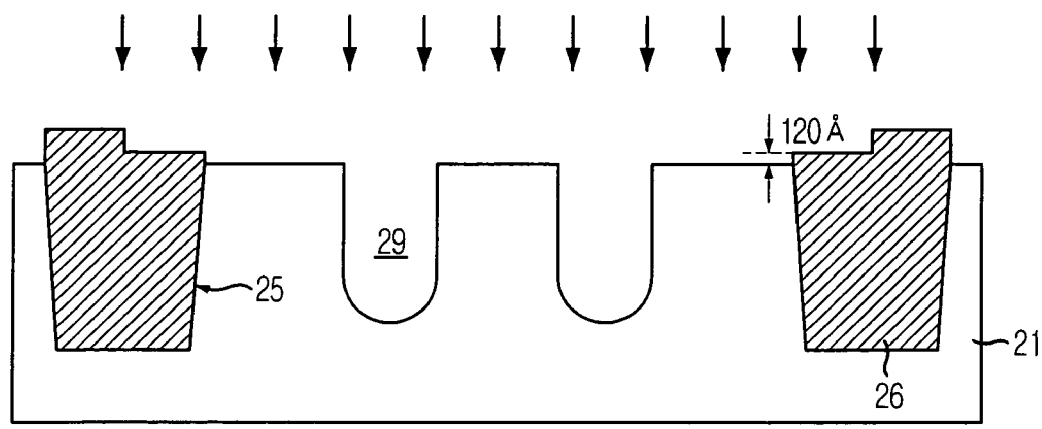

As shown in FIG. 2I, a thermal oxide layer is formed in a thickness of approximately 50 Å. Herein, the thermal oxide layer is formed to be used as an ion implantation barrier during a threshold (Vt) ion implantation process and a well formation process. The thickness of the device isolation regions 26 does not change after the thermal oxide layer is formed.

Subsequently, the well formation process and the Vt ion implantation process are performed, and then the thermal oxide layer is removed by employing a wet etching process. Herein, the wet etching process etches approximately 70 Å of portions of the device isolation regions 26, and thus, the device isolation regions 26 maintain a thickness of approximately 120 Å from the surface of the substrate 21.

Furthermore, a pre-cleaning process for a subsequent gate oxide layer is performed. After the pre-cleaning process, a height difference between the substrate 21 and the device isolation regions 26 can be controlled to be within a range of approximately 150 Å and approximately 200 Å.

Figure 2J:
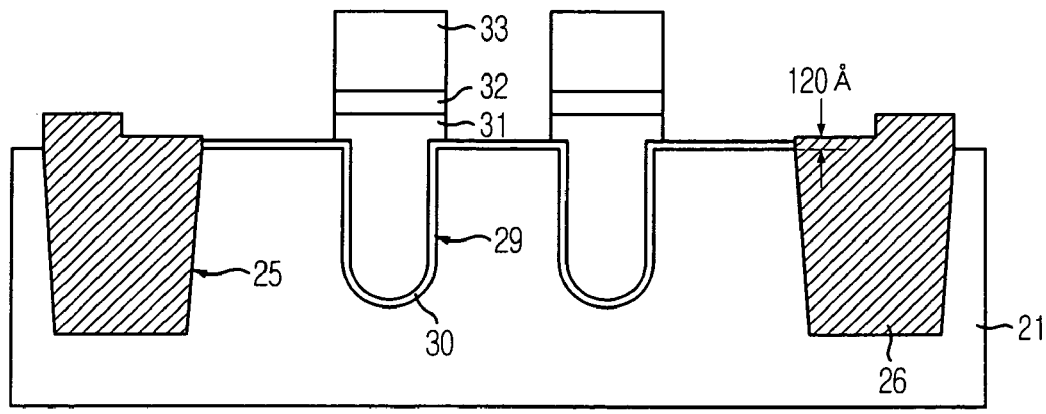

As shown in FIG. 2J, the aforementioned gate oxide layer 30 is formed over the substrate 21 through a gate oxidation process, and then recess gate structures are formed on the gate oxide layer 30. The recess gate structures are formed by sequentially forming a polysilicon layer 31, a tungsten silicide layer 32, and a gate hard mask layer 33 on the gate oxide layer 30, and performing a gate patterning process.

According to an embodiment of the present invention, the etch loss at the corner of the device isolation regions adjacent to the active region during the subsequent recess gate process can be reduced by forming the pad oxide layer by employing the CVD method, forming the device isolation regions by employing high density plasma oxide, and maintaining the etch selectivity of the pad oxide layer 22 to the device isolation regions 26 at approximately 2:1 or higher, i.e., approximately 2:1 to approximately 5:1, using HF. Since the pad oxide layer is formed by employing the CVD method, which has a faster etch rate than the device isolation regions, the etch loss of the device isolation regions can be reduced, resulting in an improved refresh characteristic.

The present application contains subject matter related to the Korean patent application No. KR 2005-0058148, filed in the Korean Patent Office on Jun. 30, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a pad oxide layer on a substrate;
    forming a pad nitride layer on the pad oxide layer;
    patterning the pad nitride layer and the pad oxide layer;
    etching predetermined portions of the substrate using the patterned pad nitride layer as an etch barrier to thereby form trenches;
    filling an insulation layer into the trenches to thereby form device isolation regions, wherein the patterned pad nitride layer and the patterned pad oxide layer are interposed between the device isolation regions and the device isolation regions are exposed;
    simultaneously removing the pad nitride layer while removing a portion of the insulation layer for the device isolation regions and a portion of the pad oxide layer, wherein a thickness of the removal portion of the device isolation regions is smaller than a thickness of the removal portion of the pad oxide layer due to a different etching rate between the insulation layer and the pad oxide layer;
    forming recesses by etching predetermined portions of the pad oxide layer and the substrate;
    removing the pad oxide layer;
    forming a gate oxide layer along a profile of the resultant structure having recesses; and
    forming gate structures of which bottom portions are buried in the recesses on the gate oxide layer,
    wherein a whole top surface of the insulation layer for the device isolation regions remains higher than a top surface of the substrate.

2. The method of claim 1, wherein the pad oxide layer is formed in a thickness ranging from approximately 100 Å to approximately 300 Å.

3. The method of claim 1, wherein the pad oxide layer is formed at a temperature ranging from approximately 750° C. to approximately 850° C.

4. The method of claim 1, wherein the device isolation regions include high density plasma oxide.

5. The method of claim 1, wherein the removing of the pad nitride layer comprises controlling a height difference between the device isolation regions and a surface of the substrate to be within a range of approximately 400 Å and approximately 700 Å.

6. The method of claim 1, wherein the removing of the pad oxide layer is performed by using hydrogen fluoride (HF).

7. The method of claim 1, wherein the forming of the recesses include:
    forming a hard mask layer on the pad oxide layer;
    forming recess masks on the hard mask layer;
    patterning the hard mask layer using the recess masks as an etch barrier;
    removing the recess masks;
    etching the pad oxide layer using the patterned hard mask layer as an etch barrier; and
    etching predetermined portions of the substrate exposed after the etching of the pad oxide layer, using the patterned hard mask layer as an etch barrier.

8. The method of claim 1, wherein the forming of the gate oxide layer includes:
    performing a first pre-cleaning process after the pad oxide layer is removed;
    forming a thermal oxide layer on the substrate;
    performing an ion implantation process;
    removing the thermal oxide layer;
    performing a second pre-cleaning process; and
    forming the gate oxide layer on the substrate.

9. The method of claim 1, wherein the filling of the insulation layer into the trenches includes:
    forming the insulation layer over patterned portions of the pad nitride layer and the pad oxide layer, filling the trenches, the insulation layer etched at a slower rate than the pad oxide layer; and
    planarizing the insulation layer until the pad nitride layer is exposed to thereby form the device isolation regions.

10. The method of claim 1, wherein the pad oxide layer is formed by employing a chemical vapor deposition (CVD) method.

11. The method of claim 5, wherein the removing of the pad nitride layer is performed by using a phosphoric acid solution.

12. The method of claim 7, wherein the hard mask layer includes one selected from the group consisting of polysilicon, silicon oxynitride (SiON), and plasma enhanced nitride.

13. The method of claim 8, wherein during the first pre-cleaning process, a height difference between the substrate and the device isolation regions is controlled to be within a range of approximately 150 Å to approximately 200 Å.

14. The method of claim 8, wherein during the second pre-cleaning process, a height difference between the substrate and the device isolation regions is controlled to be within a range of approximately 150 Å to approximately 200 Å.

15. A method for fabricating a semiconductor device, comprising:
    forming a first insulation layer on a substrate;

forming a second insulation layer on the first insulation layer;

patterning the first insulation layer and second insulation layer;

etching predetermined portions of the substrate using the patterned second insulation layer as an etch barrier to thereby form trenches;

filling a third insulation layer into the trenches to thereby form device isolation regions, wherein the patterned second insulation layer and the patterned first insulation layer are interposed between the device isolation regions and the device isolation regions are exposed;

removing the second insulation layer while removing a portion of the third insulation layer and a portion of the first insulation layer, wherein a thickness of the removal portion of the third insulation layer is smaller than a thickness of the removal portion of the first insulation layer due to a different etching rate between the third insulation layer and the first insulation layer;

forming recesses by etching predetermined portions of the first insulation layer and the substrate;

removing the first insulation layer; and forming gate structures of which bottom portions are buried in the recesses on a gate oxide layer, wherein a whole top surface of the device isolation regions remains higher than a top surface of the substrate.

16. The method of claim 15, wherein the third insulation layer includes a high density plasma oxide layer.

17. The method of claim 15, wherein the first insulation layer is a pad oxide layer and the second insulation layer is a pad nitride.

18. The method of claim 15, wherein the first insulation layer is formed by employing a chemical vapor deposition (CVD) method.

19. The method of claim 16, wherein the removing of the first insulation layer is performed by using hydrogen fluoride (HF).

* * * * *